United States Patent [19]

Javeri

[11] Patent Number: 4,683,437
[45] Date of Patent: Jul. 28, 1987

[54] FREQUENCY SUBTRACTOR

[75] Inventor: Rupin J. Javeri, Elk Grove, Ill.

[73] Assignee: Motorola, Inc., Schaumburg, Ill.

[21] Appl. No.: 871,228

[22] Filed: Jun. 6, 1986

[51] Int. Cl.[4] .......................................... H03D 13/00
[52] U.S. Cl. ..................................... 328/133; 307/525
[58] Field of Search ................ 328/133, 134; 307/525, 307/526, 527; 73/708

[56] References Cited

U.S. PATENT DOCUMENTS

| | | | |
|---|---|---|---|
| 3,626,307 | 12/1971 | Koyama | 328/133 |
| 3,656,063 | 4/1972 | Vollmer | 307/525 |
| 4,050,024 | 9/1977 | Winston, IV | 328/134 |
| 4,286,220 | 8/1981 | Zalessky et al. | 328/133 |
| 4,392,382 | 7/1983 | Myers | 73/708 |
| 4,550,611 | 11/1985 | Czarnocki | 73/708 |

OTHER PUBLICATIONS

Gasperini, "Digital Troubleshooting", 1975–1976, pp. 9.3.

Primary Examiner—Stanley D. Miller
Assistant Examiner—Trong Quang Phan
Attorney, Agent, or Firm—John H. Moore

[57] ABSTRACT

A method and apparatus are disclosed for electronically processing a variable frequency input signal and a reference input signal to develop an output signal representative of the frequency difference between the two input signals. The state of the variable frequency signal is sampled upon the occurrence of each leading edge of the reference signal to produce a first output signal. The state of the variable frequency signal is also sampled upon the occurrence of each trailing edge of the reference signal to produce a second output signal. The two output signals are preferably ORed to develop the final output signal.

11 Claims, 4 Drawing Figures

—PRIOR ART—

FREQUENCY SUBTRACTOR

FIELD OF THE INVENTION

This invention is directed to an electronic frequency subtractor which receives two signal inputs of different frequencies and develops an output signal whose frequency is equal to the frequency difference between the input signals.

BACKGROUND OF THE INVENTION

Frequency subtractors of the type discussed herein are frequently used with certain sensor circuitry which senses air pressure, for example, and develop two signal outputs. One output is typically a signal ($F_s$) whose frequency varies in accordance with changes in the sensed variable (air pressure), and the other signal ($F_r$) is a constant frequency, reference signal. These two signals are typically applied to a frequency subtractor (such as shown in FIG. 1) in the form of a flip-flop circuit whose output consists of a square-wave signal whose frequency is equal to the difference ($F_r - F_s$) in frequency between the signal inputs. That frequency difference is representative of the sensed variable and is usually processed for further use in accordance with the particular application. U.S. Pat. Nos. 4,392,382 and 4,550,611, assigned to the assignee of this invention, illustrate pressure sensor applications of such a frequency subtractor.

As discussed above, the heart of the typical frequency subtractor is a flip-flop circuit. In the case where a D-type flip-flop is used, the signals $F_s$ and $F_r$ are applied to the "D" and "clock" inputs, respectively, while the output $F_r - F_s$ is developed at the Q output. This relatively simple approach to finding the difference between two frequencies is cost-effective and practical for many applications. However, the output signal representative of $F_r - F_s$ contains an inherent uncertainty due to jitter caused when the flip-flop is clocked by $F_r$ at about the same time that the signal $F_s$ is undergoing a transition. This problem of jitter is discussed in more detail below. Suffice it to say at this point that the jitter in the output of such a frequency subtractor may account for a large fraction of the total error that the system can tolerate. In systems requiring more precision, the jitter must be substantially reduced.

Another factor to consider in precision systems is the amount of quantization error associated with the frequency subtractor. With the conventional type of subtractor shown in FIG. 1, the quantization error (discussed in more detail later) severely limits the speed with which the frequency subtractor can develop an accurate output, and it also contributes to jitter.

OBJECTS OF THE INVENTION

It is a general object of the invention to provide an improved frequency subtractor.

It is a more specific object of the invention to provide a frequency subtractor which exhibits less jitter.

It is another object of the invention to provide a frequency subtractor which exhibits a smaller quantization error.

It is yet another object of the invention to provide a frequency subtractor which meets the foregoing objectives without adding substantial complexity or cost thereto.

DESCRIPTION OF THE PREFERRED EMBODIMENT

Before proceeding to a discussion of the invention, a typical prior art frequency subtractor will be described in some detail in order to better appreciate the problems it can have and to understand how the present invention solves those problems. Accordingly, reference is now made to FIG. 1 which illustrates a conventional frequency subtractor in a form of a D-type flip-flop 10. This flip-flop 10 is shown as it might be used in a typical pressure sensing system which has a sense oscillator 12 and a reference oscillator 14. The sense oscillator 12 includes a variable capacitor $C_x$ which is usually a part of a capacitive pressure transducer which causes the value of $C_x$ to vary in accordance with the pressure of the air in the environment where the sensor is located. As the value of $C_x$ is changed by the sensed air pressure, the sense oscillator 12 develops a "sense" signal $F_s$ whose frequency changes in accordance with the changes in the value of $C_x$. (As used herein, a "sense" signal means an electrical signal having a frequency which changes in response to changes in a sensed variable such as air pressure.) The illustrated sense signal $F_s$ is coupled to the D input of the flip-flop 10.

The reference oscillator 14 includes a fixed capacitor $C_r$ which is used to establish a reference frequency in the oscillator 14. The output of the oscillator 14 is the reference signal $F_r$ which is coupled to the clock input of the flip-flop 10. With this arrangement, the Q output of the flip-flop 10 develops a squarewave signal $F_r - F_s$ whose frequency is equal to the difference in frequency between the signal inputs at the D and the clock inputs to the flip-flop. A divider 15 is usually included to divide the output of the flip-flop 10 and thus provide an averaged output signal $F_o$.

Figure 2:
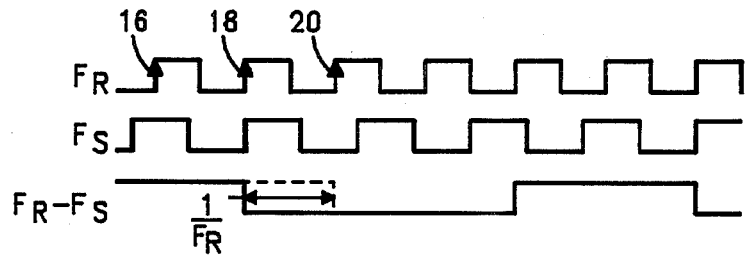
FIG. 2 depicts waveforms useful in explaining the operation of the subtractor shown in FIG. 1.

Referring now to FIG. 2, the illustrated waveforms show the inputs $F_s$ and $F_r$ to the flip-flop 10 as well as the output $F_r - F_s$ which appears at the Q output. In operation, the flip-flop 10 effectively samples the level of the signal $F_s$ each time the reference signal $F_r$ experiences a positive-going transition. The level which is sensed upon such a transition is then latched at the Q output. For example, when the signal $F_r$ experiences a positive-going transition 16, the signal $F_s$ is at a high level and thus the Q output is also latched high. When the next positive-going transition 18 occurs, the signal $F_s$ is also undergoing a transition. Consequently, the transition being experienced by the sense signal $F_s$ could be interpreted either as a high level or a low level, depending on its timing relative to the transition 18. Thus, here is some uncertainty to whether the Q output of flip-flop 10 will latch at a high level or at a low level. As shown by the solid line in FIG. 2, it is assumed that the signal $F_s$ was sensed as being low at the time of transition 18, wherefore the Q output was also latched low. A slight change in the timing of the signal $F_s$ could have resulted in the Q output being latched high as indicated by the dashed line in FIG. 2.

On the next positive-going transition 20 of the signal $F_r$, the signal $F_s$ is definitely at a low level, whereupon the Q output of the flip-flop 10 is also latched low.

The result of the uncertainty which occurred at the transition 18 is shown in FIG. 2 as an uncertainty in the level of the Q output of the flip-flop 10 between the times of the transitions 18 and 20. In other words, the Q output of flip-flop 10 could have been either high or low between transitions 18 and 20, and the duration of that uncertain period of time is equal to the period of the reference signal $F_r$. In some applications which require a high degree of accuracy, that much uncertainty in the output of the flip-flop 10 is unacceptable. The way in which such uncertainty is substantially reduced is described below.

Figure 1:
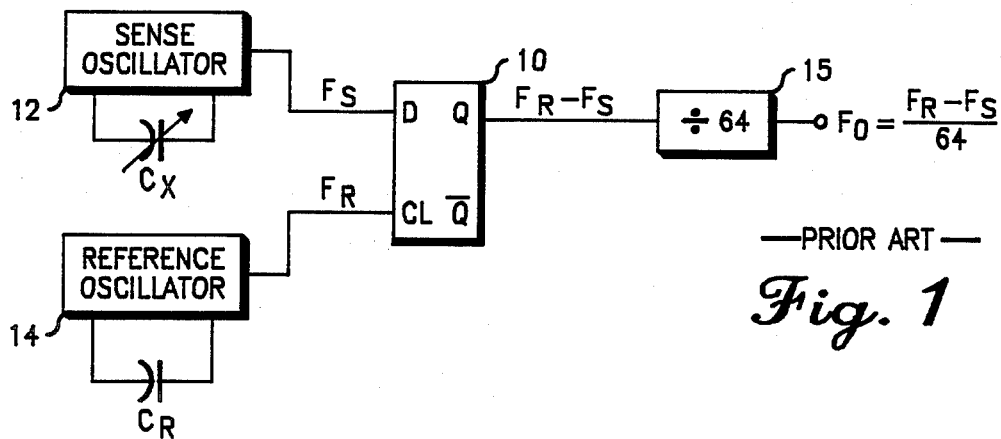
FIG. 1 shows a conventional frequency subtractor as typically used with a pressure sensing system.

Another drawback of the subtractor shown in FIG. 1 is its quantization error. This type of error, discussed in more detail below, arises as a result of $F_r - F_s$ being able to change in increments which are directly related to the period of the signal $F_r$.

In the discussion which follows, reference will be made to a "sense" signal and a "reference" signal. As mentioned above, a sense signal may be, for example, the signal output developed by the sense oscillator 12 in FIG. 1 or any other signal which varies in response to a variable being sensed or measured. Further, a reference signal is meant to indicate a signal against which a sense signal is to be compared, whether or not the reference signal changes. In most cases, and in the embodiment described below, the reference signal will be a fixed frequency signal while the sense signal will vary in frequency. Also, the subtractor which is discussed immediately below is useful primarily in situations where the frequency of the reference frequency is greater than the frequency of the sense signal, but not more than about twice as great as the frequency of the sensed signal.

According to the subtracting technique described herein, the sense signal is sampled in a manner such that the sampling occurs twice as often as is conventional in order to reduce the amount of jitter in the ultimate output signal, and also to reduce the subtractor's quantization error. More particularly, the sense signal is sampled upon the occurrence of each leading edge of the reference signal so as to develop a first binary (high/low) signal whose state (e.g. high or low) depends on the sampled state of the sense signal. The sense signal is also sampled on the occurrence of each trailing edge of the reference signal so as to develop a second binary signal whose state depends upon the sampled state of the sense signal. The first and second binary signals thus developed are then logically combined, preferably in an OR gate, to develop the ultimate output signal. As will be shown, that output signal experiences only one-half the jitter that is developed by conventional subtractors and one-half the quantization error.

Figure 3:
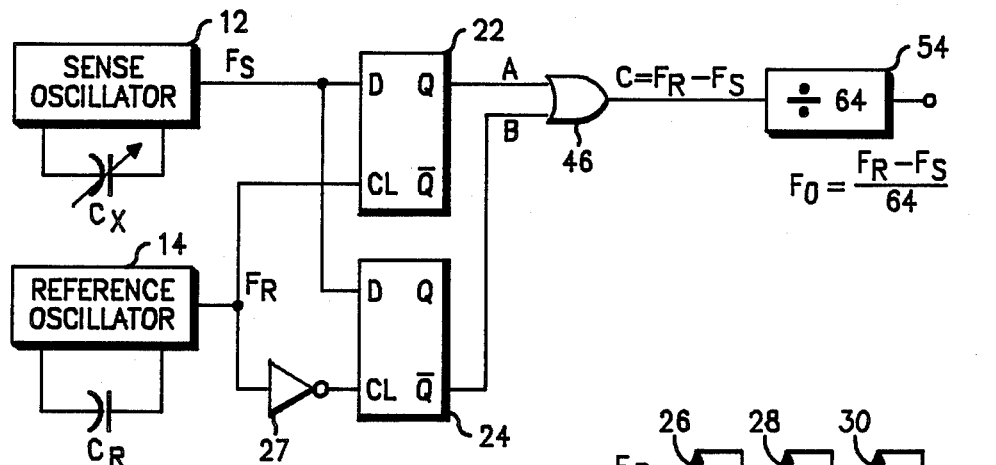
FIG. 3 illustrates a preferred embodiment of a subtractor in accordance with the invention. This subtractor is also shown as it may be used with a pressure sensing system.

Referring now to FIG. 3, there is shown a subtractor which operates according to the method discussed above and which is illustrated as being coupled to the conventional sense oscillator 12 and to the conventional reference oscillator 14. These two inputs to the subtractor are merely exemplary of the types of signals which the subtractor can deal with.

Using the terminology previously employed, the sense oscillator 12 is shown as developing a sense signal indicated as $F_s$ and the reference oscillator is shown as indicating a reference signal indicated as $F_r$. As shown, the signal $F_s$ is coupled to the D input of a first flip-flop 22 and also to the D input of a second flip-flop 24. Thus, both these D-type flip-flops will sample the sense signal $F_s$ when they are clocked.

Figure 4:
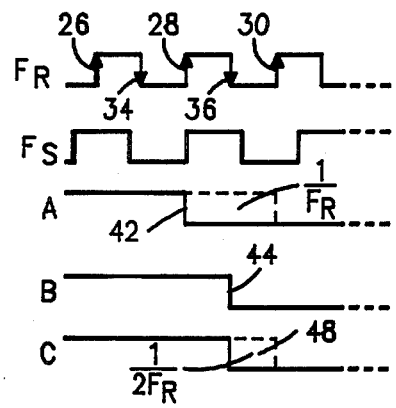
FIG. 4 shows various waveforms which are used to explain the operation of the subtractor shown in FIG. 3.

To clock the flip-flop 22, the reference signal $F_r$ is coupled to the clock input thereof so that the Q output of the flip-flop 22 develops a binary output signal which is denominated as signal A in FIGS. 3 and 4. As the waveforms in FIG. 4 illustrate, the flip-flop 22 samples the sense signal $F_s$ on the leading edges (positive-going transitions) of the reference signal $F_r$. The Q output (waveform A) of the flip-flop 22 is latched to the state of the sense signal $F_s$ upon the occurrence of each leading edge transition of the reference signal. Thus, at the transition 26 of $F_r$, the Q output (waveform A) of flip-flop 22 is latched high. At the transition 28, the signal $F_s$ is assumed to be low (but, as described above with respect to FIG. 2, $F_s$ could be high), so the Q output of the flip-flop 22 is latched low and remains low through and beyond the transition 30. Waveform A will return to a high level when the flip-flop 22 is clocked coincidentally with $F_s$ being at a high level. Note the duration of uncertainty between the transitions 28 and 30. This uncertainty exists for the same reasons as discussed above in connection with FIGS. 1 and 2.

The flip-flop 24 may be identical to the flip-flop 22 insofar as its construction is concerned, but its inputs and outputs are configured somewhat differently in order that the flip-flop 24 may sample the sense signal $F_s$ on transitions of the reference signal which are opposite to the transitions at which the flip-flop 22 samples the sense signal $F_s$. This is accomplished by coupling the sense signal to the D input of the flip-flop 24, coupling the reference signal $F_r$ to an inverter 27, and coupling the output of the inverter 27 to the clock input of the flip-flop 24. The output (waveform B) of the flip-flop 24 is taken at the not Q terminal.

Because of the inclusion of the inverter 27 between the clock input of flip-flop 24 and the reference signal $F_r$, the flip-flop 24 will be clocked on each trailing edge (negative-going transition) of the reference signal. Thus, when the negative-going transition 34 of signal $F_r$ occurs, the flip-flop 24 samples the signal $F_s$ and latches its not Q output (waveform B) in a high state. At the next negative-going transition 36, the not Q output of flip-flop 24 is latched in the low state. Although there has been no uncertainty in the state of the signal $F_s$ during any illustrated negative-going transition, it should be clear that waveform B can and generally will experience the same kind of uncertainty as is shown for waveform A, although waveforms A and B will not experience uncertainty at the same time.

An examination of waveforms A and B (FIG. 4) reveals that the sense signal ($F_s$) is sampled by flip-flop 22 which is clocked in synchronism with a reference signal ($F_r$) to develop a first output signal (waveform A) that is representative of the frequency difference between the sense signal and the reference signal. As shown, that first signal includes an area of uncertainty (the dashed portion) whose duration is equal to the period of the reference signal.

The same sense signal is sampled by flip-flop 24 which is clocked in synchronism with the same reference signal so as to develop a second signal (waveform B) having amplitude transitions (between high and low levels) that are offset from the amplitude transitions of the first signal (waveform A) by one-half the period of the reference signal. Such offset is illustrated by the difference in time between the transition 42 in waveform A and the transition 44 in waveform B.

The first and second signals are further processed as illustrated by coupling the Q output of flip-flop 22 to one input of a logical OR gate 46, and by coupling the not Q output of the flip-flop 24 to the other input of the OR gate 46. The resulting output from OR gate 46 (waveform C) is shown in FIG. 4. Note that the area of uncertainty 48 (the dashed portion of waveform C) is one-half the size of the area of uncertainty in waveform A. Consequently, waveform C will have one-half the jitter that is associated with either waveform A or waveform B (when it has uncertainty). Accordingly, waveform C is less prone to error than either waveform A, waveform B, or the prior art shown in FIG. 1.

In addition to reducing jitter by one-half, the output signal developed according to the invention has less quantization error and reaches an accurate indication of the frequency difference $F_r - F_s$ in a shorter time than conventional subtractors. The following example illustrates this point. If the signal $F_r$ has a frequency of 100 KHz and the signal $F_s$ has a frequency of 87.65 KHz, then $T_r$ (the period of $F_r$) equals 10 microseconds and $T_s$ (the period of $F_s$) equals 11.41 microseconds. Further, it can be shown that $T_o$ (the period of the subtracted signal, $F_r - F_s$) is equal to $T_r$ times $T_s$ divided by $(T_s - T_r)$. For this example, $T_o$ would mathematically equal 8.1 $T_r$ or 81 microseconds. But subtraction of the type illustrated in FIG. 1 permits the period of the signal $F_r - F_s$ to change only in multiples of $T_r$. For this example, $T_r$ equals 10 microseconds, so the period of $F_r - F_s$ is permitted to change in multiples of 10 microseconds. Obviously then, the instantaneous output of the flip-flop 10 will usually not be exactly equal to $F_r - F_s$, although its average value will be.

Continuing this example further, the instantaneous period of $F_r - F_s$ from flip-flop 10 will not equal 81 microseconds, but its output will consist of successive signals whose periods can change by multiples of 10 microseconds and whose average value will equal 81 microseconds. Thus, flip-flop 10 could provide ten successive signal outputs whose periods (in microseconds) are 80, 80, 80, 80, 80, 80, 80, 80, 80, 90. The divider 15 averages those signals to develop an output whose period is 81 microseconds. Note that 10 samples were required before the average value reached an accurate level.

On the other hand, waveform C developed in accordance with the invention can change in multiples of 5 microseconds because the sense signal $F_s$ is, in effect, being sampled twice as fast as it is conventionally sampled. Thus, the output of the OR gate 46 is a succession of signals whose periods (in microseconds) are: 80, 80, 80, 80, 85. The averaged output from the divider 54 equals 81 microseconds. Note that only five samples are needed to reach a correct average value, thereby providing an output signal which reaches an accurate average value more rapidly. Further, because the output of divider 54 changes in increments of five microseconds as compared to increments of ten microseconds for the conventional circuit of FIG. 1, jitter is further reduced.

Returning briefly to FIG. 3, the output of the OR gate 46 may be coupled, as shown, to a divider 54 whose function is to divide waveform C by 64 and thus develop an output signal $F_o$ equal to $(F_r - F_s)$ divided by 64. The divider 54 thus averages the output of the OR gate 46.

The signal $F_o$ may be further processed, if needed, to customize it for use in a particular application. As it exists at the output of the divider 54, the signal $F_o$ is an accurate representation of the average frequency difference $F_r - F_s$ and has only half the jitter that is associated with conventional subtractors. These results have been achieved with a minimum of extra hardware and circuit complexity.

Although the invention has been described in terms of a preferred embodiment, it will be obvious to those skilled in the art that many alterations and variations may be made without departing from the invention. To state but one example of such an alteration, the subtraction technique disclosed herein could be easily implemented in a software program for a microprocessor. Accordingly, it is intended that all such alterations and variations be considered as within the spirit and scope of the invention as defined by the appended claims.

What is claimed is:

1. A method of processing a sense signal and a reference signal that has leading and trailing edges to develop an output signal representative of the difference in frequency between the reference signal and the sense signal, comprising:

sampling the sense signal upon the occurrence of each leading edge of the reference signal so as to develop a first binary signal whose state depends on the sampled state of the sense signal;

sampling the sense signal upon the occurrence of each trailing edge of the reference signal so as to develop a second binary signal whose state depends on the sampled state of the sense signal; and logically ORing the first and second signals to develop the output signal.

2. A method as set forth in claim 1 wherein the state of the first binary signal is the same as the sampled state of the sense signal, and wherein the state of the second binary signal is the opposite of the sampled state of the sense signal.

3. A method as set forth in claim 2 wherein the sense signal corresponds to the output of a sense oscillator, wherein the reference signal corresponds to the output of a reference oscillator, and wherein the frequency of said output signal corresponds to the frequency difference between the sense oscillator and the reference oscillator.

4. A subtractor for developing an output signal that is representative of the frequency difference between a sense signal and a reference signal that has leading and trailing edges, comprising:

first means for sampling the sense signal upon the occurrence of each leading edge of the reference signal so as to develop a first binary signal whose state depends on the sampled state of the sense signal;

second means for sampling the sense signal upon the occurrence of each trailing edge of the reference signal so as to develop a second binary signal whose state depends on the sampled state of the sense signal; and means for logically ORing the first and second signals to develop the output signal 5. A subtractor as set forth in claim 4 wherein said first sampling means includes a first flip-flop for sampling the sense signal and wherein said second sampling means includes a second flip-flop for sampling the same sense signal.

6. A subtractor as set forth in claim 5 wherein said first flip-flop is clocked by the reference signal, wherein the second sampling means includes an inverter for inverting the reference signal, and wherein the second flip-flop is clocked by the inverted reference signal.

7. A subtractor as set forth in claim 6 wherein the first flip-flop has a Q output, wherein the second flip-flop has a not Q output, and wherein said Q and not Q outputs correspond to said first and second binary signals.

8. A subtractor for developing an output signal that is representative of the frequency difference between a sense signal and reference signal, comprising:
  a first flip-flop receiving the sense signal and being clocked in synchronism with the reference signal for developing a first signal that is representative of the frequency difference between the sense signal and the reference signal and that has amplitude transitions between high and low levels;
  a second flip-flop receiving the sense signal and being clocked in sychronism with the reference signal for developing a second signal having amplitude transitions that are offset from the amplitude transitions of the first signal by one-half the period of the reference signal; and
  means for combining the first and second signals to develop an output signal with reduced jitter.

9. A subtractor as set forth in claim 8 wherein said combining means comprises an OR gate.

10. A subtractor as set forth in claim 8 wherein said first and second flip-flops are clocked on different transitions of the reference signal.

11. A subtractor for developing an output signal that is representative of the frequency difference between a first signal and a second signal that has leading and trailing edges, comprising:
  first means for sampling the first signal upon the occurence of each leading edge of the second signal so as to develop a first binary signal whose state depends on the sampled state of the first signal;
  second means for sampling the first signal upon the occurence of each trailing edge of the second signal so as to develop a second binary signal whose state depends on the sampled state of the first signal; and
  means for logically ORing the first and second binary signals to develop the output signal.

* * * * *